(12) United States Patent
Toth et al.

(10) Patent No.: US 6,275,158 B1
(45) Date of Patent: Aug. 14, 2001

(54) DEVICE ARRANGED FOR CONTACTLESS COMMUNICATION AND PROVIDED WITH A DATA CARRIER WITH FULLY ENCLOSED CONNECTION MEANS FOR ELECTRICALLY CONNECTING A CHIP AND A PASSIVE COMPONENT

(75) Inventors: Marcus Toth; Wolfgang Scheucher, both of Gratkorn; Gerald Schaffler; Heinz Kwas, both of Graz, all of (AT)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/467,594

(22) Filed: Dec. 20, 1999

(30) Foreign Application Priority Data

Dec. 22, 1998 (EP) .................................................. 98890377

(51) Int. Cl.[7] .................................................. G08B 13/14
(52) U.S. Cl. .................................. 340/572.8; 340/572.1; 340/5.8; 340/5.31; 340/5.61; 340/10.1; 361/737; 361/748; 361/777; 29/829; 29/846
(58) Field of Search ........................... 340/572.1, 572.8, 340/5.8, 10.2, 10.1, 5.31, 5.61; 361/737, 748, 760, 772, 774, 777, 779; 342/51; 307/10.5; 29/855, 825, 829, 846; 343/895, 872, 795, 822

(56) References Cited

U.S. PATENT DOCUMENTS

| 4,068,232 | * | 1/1978 | Meyers et al. ........................ 342/44 |
| 4,816,839 | * | 3/1989 | Landt ................................... 343/795 |
| 4,931,664 | * | 6/1990 | Knoll ................................... 307/10.3 |
| 5,293,065 | | 3/1994 | Chan .................................... 257/667 |
| 5,532,522 | * | 7/1996 | Dietz et al. .......................... 307/10.5 |
| 5,774,043 | * | 6/1998 | Mizuno et al. ....................... 340/426 |
| 6,031,459 | * | 2/2000 | Lake .................................. 340/572.8 |
| 6,043,745 | * | 3/2000 | Lake .................................. 340/572.1 |
| 6,072,383 | * | 6/2000 | Gallagher, III et al. ............. 340/10.2 |
| 6,104,311 | * | 8/2000 | Lastinger ............................. 340/10.1 |

FOREIGN PATENT DOCUMENTS

| 19633923s1 | 2/1998 | (DE) . |
| 19640260A1 | 4/1998 | (DE) . |
| 0400324A2 | 12/1990 | (EP) . |
| WO9712263 | 4/1997 | (WO) . |

* cited by examiner

*Primary Examiner*—Benjamin C. Lee

(57) ABSTRACT

The data carrier (4) of a device (1) provided with a data carrier (4) includes a casing (5) which is formed by injection molding and in which there are accommodated holding means (6) for holding a chip (7) and at least one transmission coil (8), and also includes electrically conductive connection means (16) which are connected to the holding means (6) and are arranged to connect the chip terminals (9, 10) of the chip (7) to the coil terminals (11, 12) of the transmission coil (8); the holding means (6) include a holding foil (17) and the connection means (16) are realized while utilizing a conductor frame (18) and are formed by conductor segments (20, 21, 22, 23, 24, 25, 28, 29, 30, 31; 42, 43, 45, 46) of the conductor frame (18) and are completely enclosed by the casing (5), at least parts of said conductor segments (20, 21, 22, 23, 24, 25, 28, 29, 30, 31; 42, 43, 45, 46) being connected to the holding foil (17) in order to hold said conductor segments.

16 Claims, 2 Drawing Sheets

DEVICE ARRANGED FOR CONTACTLESS COMMUNICATION AND PROVIDED WITH A DATA CARRIER WITH FULLY ENCLOSED CONNECTION MEANS FOR ELECTRICALLY CONNECTING A CHIP AND A PASSIVE COMPONENT

The invention relates to a device which is provided with a data carrier which is arranged for contactless communication with a communication station, includes a casing which consists of an electrically insulating material and is formed by injection molding, includes holding means which are surrounded by the casing and are arranged to hold a chip and at least one passive component which is suitable for contactless communication, and is also provided with electrically conductive connection means which are surrounded by the casing, thus being fully enclosed by the casing, are connected to the holding means and by means of which a respective chip terminal of the chip is electrically conductively connected to a respective component terminal of the at least one component.

The invention also relates to a data carrier which is arranged for contactless communication with a communication station, includes a casing which consists of an electrically insulating material and is formed by injection molding, includes holding means which are surrounded by the casing and are arranged to hold a chip and at least one passive component which is suitable for contactless communication, and is also provided with electrically conductive connection means which are surrounded by the casing, thus being fully enclosed by the casing, are connected to the holding means and by which of a respective chip terminal of the chip is electrically conductively connected to a respective component terminal of the at least one component.

A device of the kind set forth in the first paragraph and a data carrier of the kind set forth in the second paragraph are commercially available in a variety of versions and hence are known. The known device and the known data carrier are used, for example in an immobilizer system; the data carrier is then accommodated in the grip of a vehicle key which thus forms the known device.

The holding means of the known data carrier are formed by a thin, foil-like late which consists of a fiberglass-reinforced epoxy material whereto gold-plated copper tracks are connected. Such construction is known from the field of printed circuits. The gold-plated copper tracks then constitute the electrically conductive connection means via which the terminals to be interconnected are connected by way of soldering. Because of the small dimensions and the vulnerability of the chip and the at least one passive component, and because of the. specific construction of the holding means and the connection means, the known data carrier requires a comparatively intricate soldering operation so as to make said soldered connections; because of the construction of the copper tracks, only a limited temperature distribution takes place during soldering, possibly giving rise to comparatively high thermomechanical loads which in turn could reduce the service life. Moreover, the described holding means and connection means are comparatively expensive which is, of course, another drawback.

It is an object of the invention to eliminate the described problems and realize an improved device and an improved data carrier.

In order to achieve this object the holding means in a device of the kind set forth in the first paragraph according to the invention include a holding foil of an electrically non-conductive synthetic material, the connection means being realized while utilizing a conductor frame consisting of metal, the connection means being formed by conductor segments of said conductor frame which are completely enclosed by the casing, at least parts of the conductor segments of said conductor frame being connected to the holding foil in order to hold said conductor segments.

In order to achieve this object the holding means in a data carrier of the kind set forth in the second paragraph according to the invention include a holding foil of an electrically non-conductive synthetic material, the connection means being realized while utilizing a conductor frame consisting of metal, the connection means being formed by conductor segments of said conductor frame which are completely enclosed by the casing, at least part of the conductor segments of said conductor frame being connected to the holding foil in order to hold said conductor segments.

Taking the steps according to the invention advantageously offers a device according to the invention and a data carrier according to the invention in which the novel combination of holding means and connection means is significantly cheaper than in the known data carrier. Furthermore, a major advantage is achieved in that the novel combination of holding means and connection means also offers an absolutely reliable protection of the chip against the hazardous effects of electrostatic discharges, because the conductor segments acting as the electrically conductive connection means cannot at all be reached from outside the casing. Moreover, the construction of the connection means according to the invention ensures that fast and uniform temperature distribution takes place during the soldering of the necessary soldered connections, so that only insignificant or even no thermomechanical loading occurs and hence an advantageously long service life is ensured.

The holding foil in a device according to the invention and in a data carrier according to the invention can be utilized to hold, during the formation of the casing by molding in an injection molding tool, the conductor segments of said conductor frame which constitute the connection means and the parts of the data carrier which are connected to said conductor segments. However, it has been found that it is particularly advantageous to take the steps disclosed in the claims 2 and 10, because it is thus ensured that parts of the conductor frame which is present anyway, i.e. the holding segments of said conductor frame, are utilized to hold the conductor segments and the holding foil as well as the further components during the injection molding operation so as to form the casing.

In conjunction with the foregoing it has also been found that it is very advantageous to take the steps disclosed in the claims 3 and 11, because it is thus ensured that the complete holding foil is absolutely reliably protected against adverse external effects.

Advantageous further embodiments of a device according to the invention and a data carrier according to the invention are realized by taking the steps disclosed in the claims 4 to 8 and 12 to 16, respectively. Such further embodiments notably feature the use of a particularly advantageous and inexpensive material for the holding foil and a particularly inexpensive connection of the holding foils to the conductor segments.

The foregoing aspects and further aspects of the invention will become apparent from and will be elucidated with reference to the following embodiment.

The invention will be described in detail hereinafter on the basis of two embodiments which are shown in the drawings, however, without the invention being restricted thereto.

Figure 1:
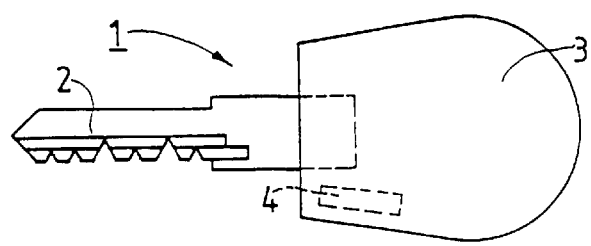
FIG. 1 is a plan view of a first embodiment of a device according to the invention which is formed by a key for a vehicle and accommodates a first embodiment of a data carrier according to the invention.

FIG. 1 shows a device 1 according to the invention which is formed by a key for a vehicle. Such a device according to the invention, however, may also be a garbage container, a car tire, a consumer electronic apparatus, a container for liquids such as oil or chemicals and the like, and many other things. The device 1 in the form of a key includes a key bit of metal and a key grip 3 of a synthetic material. A data carrier 4 according to the invention is embedded in the key grip 3.

Figure 2:
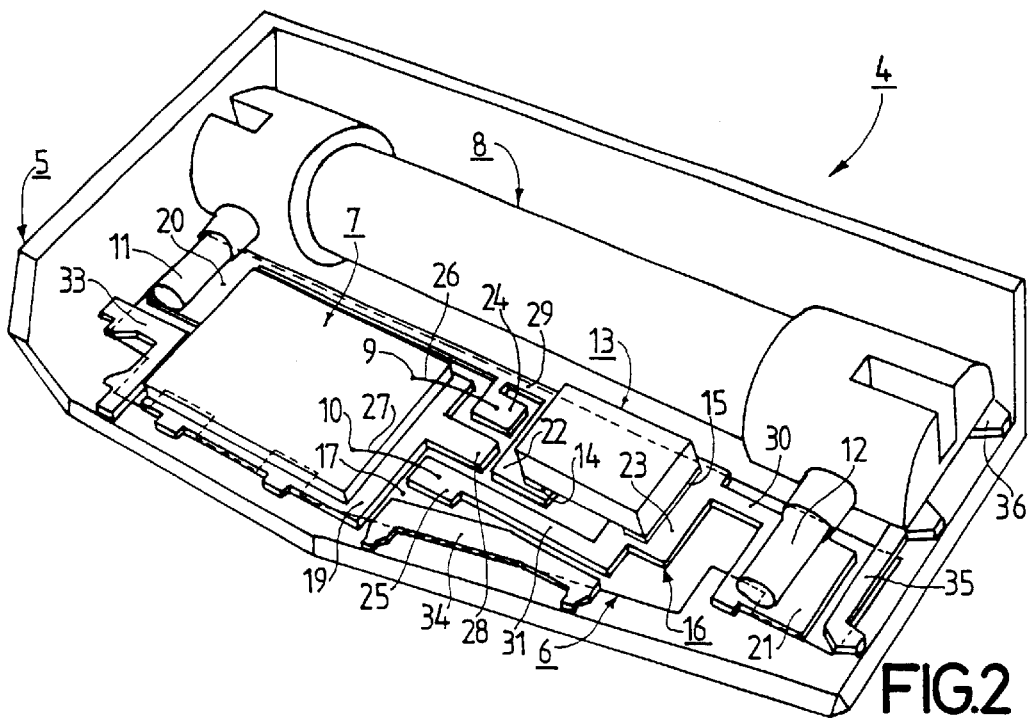
FIG. 2 is a perspective plan view, at a significantly enlarged scale, of the first embodiment of the data carrier according to the invention which is accommodated in the device shown in FIG. 1 and is provided with electrically conductive connection means and holding means.

The data carrier 4 is shown in detail in FIG. 2. The data carrier 4 includes a casing 5 which consists of an electrically insulating material and is formed by molding; the casing is partly cut away in FIG. 2 and represented diagrammatically as a rectangular housing. As has already been stated, in practice the casing 5 is formed by molding so that the casing 5 tightly surrounds all parts of the data carrier 4; however, for the sake of clarity this is not shown in FIG. 2.

The data carrier 4 includes holding means 6 which are surrounded by the casing 5 and are arranged to hold a chip 7 and a passive component 8 which is arranged for contactless communication. The chip 7 includes two chip terminals 9 and 10 which are diagrammatically shown in FIG. 2. In the present embodiment the passive component 8 is formed by a transmission coil which includes two coil terminals 11 and 12. The holding means 6 in the data carrier 4 shown in FIG. 2 are also arranged to hold a capacitor 13 which includes two capacitor terminals 14 and 15.

The data carrier 4 also includes electrically conductive connection means 16 which are surrounded by the casing 5 and are connected to the holding means 6. A respective chip terminal 9, 10 of the chip 7 is electrically conductively connected to a respective component terminal of a component by means of the connection means 16, i.e. to a respective coil terminal 11, 12 of the transmission coil 8 and also to a respective capacitor terminal 14, 15 of the capacitor 13 as will be described in detail hereinafter.

The holding means 6 in the data carrier 4 shown in FIG. 2 include a holding foil 17 which consists of an electrically non-conductive synthetic material. The holding foil 17 of the present embodiment is formed by a polyimide foil. The shape of the holding foil is particularly clearly shown in FIG. 4 in which the visible parts of the holding foil 17 are shaded so as to facilitate recognition of the holding foil. The holding foil 17 in this case has a thickness of approximately 50 μm.

Figure 3:
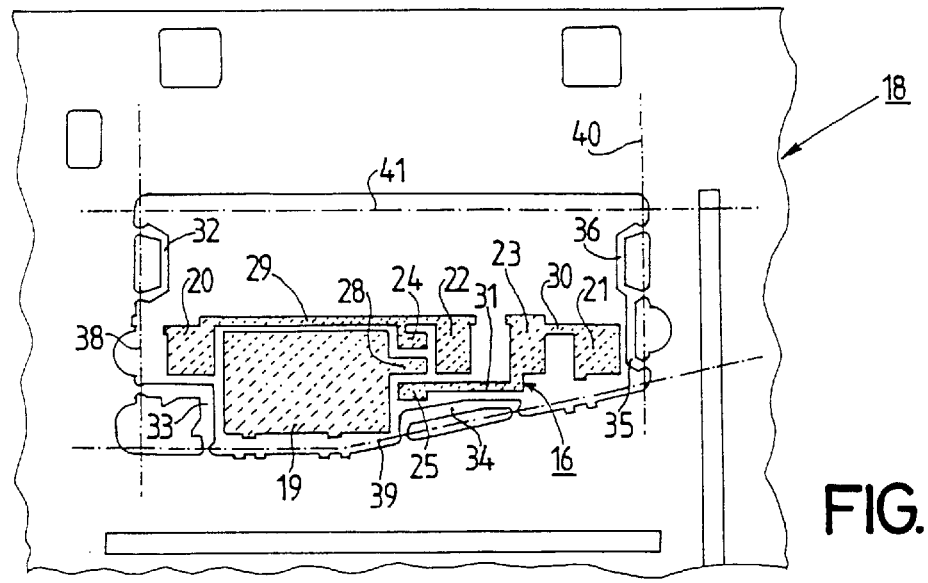
FIG. 3 is a plan view, at a significantly enlarged scale, of the electrically conductive connection means of the data carrier of FIG. 2 in an initial state.
Figure 4:
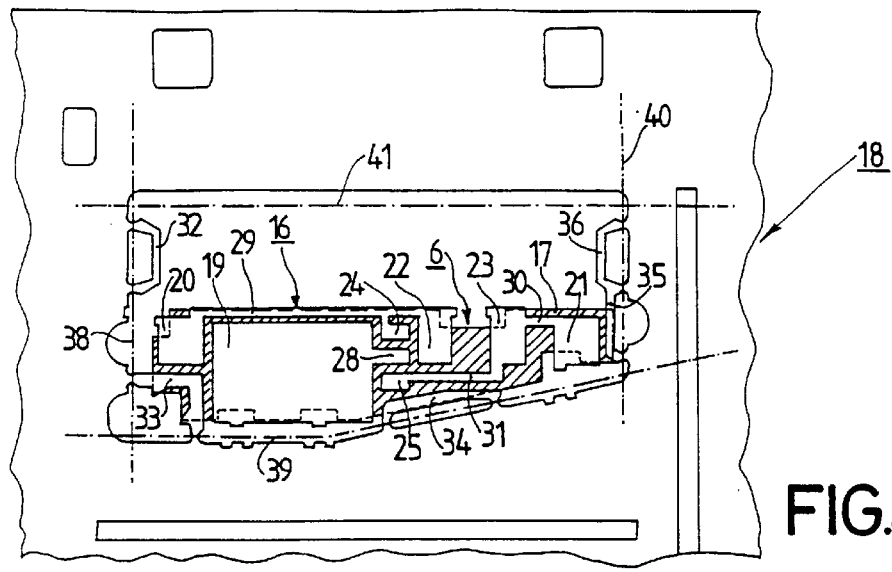
FIG. 4 shows, in the same way as FIG. 3, the electrically conductive connection means and the holding means of the data carrier of FIG. 2 in an initial state.

The connection means 6 of the data carrier 4 are preferably formed while utilizing a conductor frame 18 which consists of metal and part of which is shown in the FIGS. 3 and 4. In practice not only the connection means 16 for a data carrier 4 are realized by means of the conductor frame 18, but such a conductor frame 18 has a strip-like construction with, for example, twelve (12) rows of three (3) connection means 16 each, so, for example 36 connection means 16 in total. The conductor frame 18 in this case has a thickness of approximately 150 μm.

The connection means 16 are formed by conductor segments of said conductor frame 18. As is shown in FIG. 3, the conductor frame 18 has the following segments for the data carrier 4. The conductor frame 18 includes a holding segment 19 which is intended to hold the chip 7. There are also provided a rectangular first conductor segment 20 and a rectangular second conductor segment 21 which are intended for electrically conductive connection to the two coil terminals 11 and 12. There are also provided a rectangular third conductor segment 22 and a rectangular fourth conductor segment 23 which are intended for electrically conductive connection to the two capacitor terminals 14 and 15. Also provided are a rectangular fifth conductor segment 24 and a rectangular sixth conductor segment 25 which are intended for electrically conductive connection to two connection wires 26 and 27 (see FIG. 2) which are electrically conductively connected to the chip terminals 9 and 10. Also provided is a rectangular seventh conductor segment 28 which laterally projects from the holding segment 19 and is intended for electrically conductive connection to a so-called down-bond which is conducted to a further chip terminal of a chip. The seventh conductor segment 28 is not used in the data carrier 4 shown in FIG. 2, because it is not required for the chip 7.

The first conductor segment 20 and the third conductor segment 22 and the fifth conductor segment 24 are interconnected by way of a strip-shaped eighth conductor segment 29. The second conductor segment 21 and the fourth conductor segment 23 are interconnected by way of a strip-shaped ninth conductor segment 30. The fourth conductor segment 23 and the sixth conductor segment 25 are electrically conductively interconnected by way of a strip-shaped tenth conductor segment 31.

The electrically conductive connection means 16 in the data carrier 4 are formed by the conductor segments of said conductor frame 18, so by the ten conductor segments 20, 21, 22, 23, 24, 25, 28, 29, 30 and 31.

In addition to the conductor segments 20 to 25 and 28 to 31 of said conductor frame 18, constituting the connection means 16, said conductor frame 18 is also provided with holding segments which are mechanically and electrically separated from said conductor segments 20 to 25 and 28 to 31, that is to say a first holding segment 32 which is constructed so as to be bow-shaped, a second holding segment 33 which has an angular shape, and a third holding segment 34, a fourth holding segment 35 and a fifth holding segment 36, all three of which are constructed so as to be bow-shaped.

Parts of the conductor segments 20 to 25 and 28 to 31 of said conductor frame 18 and of the holding segments 32 to 36 of said conductor frame 18 in the data carrier 4 are connected to the holding foil 17 in order to hold the conductor segments and the holding segments; this is particularly clearly shown in FIG. 4.

The data carrier 4 is advantageously constructed so that the entire holding foil and the parts of the conductor segments 20 to 25 and 28 to 31 which are connected to the holding foil 17 are completely enclosed by the casing 5. Furthermore, the construction is advantageously such that the conductor segments 20 to 25 and 28 to 31 of said conductor frame which constitute the connection means 16 are also completely enclosed by the casing 5. The holding segments 32 to 36 of said conductor frame 18 terminate at the area of the periphery of the casing 5 as is shown in FIG. 2 for the holding segments 33, 34, 35 and 36.

Figure 5:
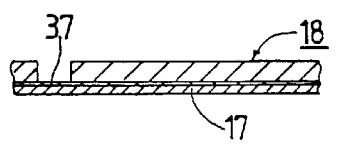
FIG. 5 is a sectional view of a part of the electrically conductive connection means and the holding means shown in FIG. 4.

Referring to FIG. 5, in respect of the mechanical connection between the holding foil 17 and the parts of the conductor segments 20 to 25 and 28 to 31 and the parts of the holding segments 32 to 36 it is also to be noted that the holding foil 17 and the parts of the conductor segments 20 to 25 and 28 to 31 and the parts of the holding segments 32 to 36 of said conductor frame 18 are connected to one another by means of an adhesive layer 37 which is formed by a hot-melt adhesive. In this case the adhesive layer 37 has a thickness of approximately 20μm.

With respect to the conductor segments 20 to 25 and 28 to 31 of said conductor frame 18 it is also to be noted that on their peripheral surfaces which are remote from the holding foil 17 the conductor segments 20 to 25 and 28 to 31 are provided with a layer of silver as denoted by shading in FIG. 3.

In the data carrier 4 shown in FIG. 2 the conductor segments 20, 29, 24 and 21, 30, 23, 31, 25 are arranged for electrically conductively connecting a respective one of the two chip terminals 9 and 10 of the chip 7 to a respective one of the two coil terminals 11 and 12 of the transmission coil 8 which is suitable for contactless communication. Furthermore, the conductor segments 22, 29, 24 and 23, 31, 25 are additionally arranged to connect a respective one of the two chip terminals 9 and 10 of the chip 7 to a respective one of the two capacitor terminals 14 and 15 of the capacitor 13.

The manufacture of the data carrier 4 shown in FIG. 2 will be described briefly hereinafter.

1. First the conductor frame 18 is formed from a solid material by punching.

2. Subsequently, parts of the conductor frame 18, i.e. the conductor segments 20 to 25 and 28 to 31, are provided with a layer of silver in conformity with FIG. 3.

3. Subsequently, the holding foil 17 of polyimide is connected to the conductor frame 18, that is to say by means of a hot-melt adhesive as already stated.

4. Subsequently, an adhesive is applied to the holding segment 19 of the conductor frame 18, and after that the chip 7 is arranged on the holding segment 19 and hence mechanically connected to the holding segment 19 with the aid of the adhesive.

5. Subsequently, the connection wires 26 and 27 are electrically conductively connected to the conductor segments 24 and 25.

6. Subsequently, solder paste is deposited on the conductor segments 20, 21, 22 and 23 by means of a dosing needle and after that the transmission coil 8 and the capacitor 13 are positioned.

7. Subsequently, a soldering operation is performed, the coil terminals 11 and 12 and the capacitor terminals 14 and 15 thus being soldered to the conductor segments 20 and as well as 22 and 23.

8. After visual inspection, the casing 5 is formed by injection molding, thus enclosing all parts of the data carrier 4.

9. Subsequently, text is printed on the casing 5, followed by the drying of the print.

10. Subsequently there is performed a punching operation during which the parts of the conductor frame 18 which project from the casing 5 are separated from the parts of the conductor frame 18 which are present within the casing 5, that is to say in separating zones which are denoted by dash/dot lines 38, 39, 40 and 41 in the FIGS. 3 and 4. This punching operation individualizes and practically finishes the data carrier 4.

11. Subsequently, a visual inspection is performed and the finished data carrier 4 is packed.

In the data carrier 4 according to the invention, the holding foil 17, acting as the holding means 6, as well as the conductor segments 20 to 25 and 28 to 31, acting as the electrically conductive connection means 16, are preferably completely enclosed by the casing 5, i.e. are completely situated within the casing 5, so that adverse effects from outside the casing 5 can be exerted neither on the holding foil 17 nor on the conductor segments 20 to 25 10 and 28 to 31.

Figure 6:
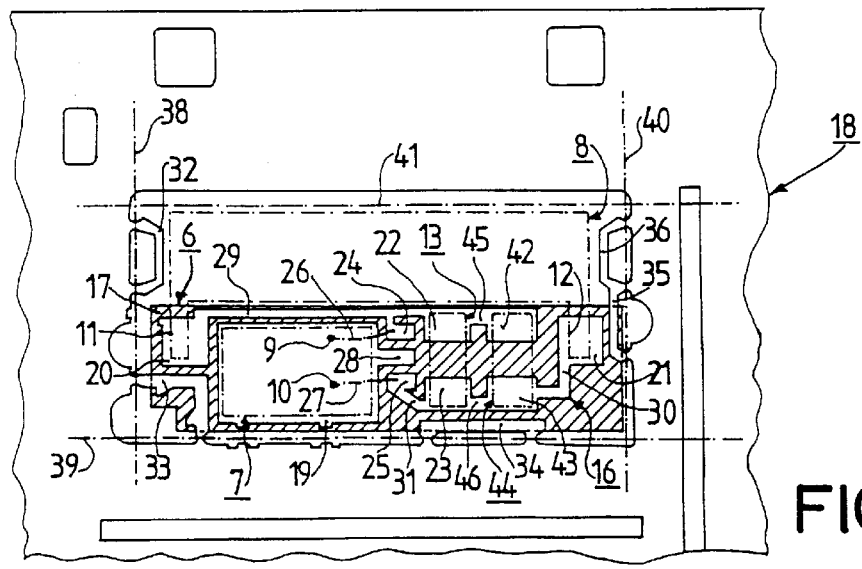
FIG. 6 shows, in the same way as FIG. 4, the electrically conductive connection means and the holding means of a second embodiment of a data carrier according to the invention.

Reference is made to FIG. 6 for the construction of the holding means 6 and the connection means 16 of a second embodiment of a data carrier according to the invention. In this context it is to be noted that the construction of the holding means 6 and the connection means 16 essentially corresponds to the construction of the holding means 6 and the connection means 16 of the data carrier shown in FIG. 2; there is a difference in that the conductor frame 18 additionally includes a rectangular eleventh conductor segment 42 and a rectangular twelfth conductor segment 43 which are arranged for electrically conductive connection to two resistor terminals (not shown) of a resistor 44 which is diagrammatically denoted by dash/dot lines in FIG. 6, like the chip 7, the transmission coil 8 and the capacitor 13. The eleventh conductor segment 42 is electrically conductively connected to the third conductor segment 22 by way of a short, thirteenth conductor segment 45. The twelfth conductor segment 43 is electrically conductively connected to the fourth conductor segment 23 by way of a short, fourteenth conductor segment 46. Thus, in the embodiment shown in FIG. 6 the conductor segments 24, 29, 22, 45, 42 and 25, 31, 23, 46, 43 are additionally arranged to connect a respective one of the two chip terminals 9 and 10 of the chip 7 to a respective one of the two resistor terminals of the resistor 44.

In the described embodiments according to the invention the holding foil 17, provided as the holding means 6, as well as the conductor segments 20 to 25 and 28 to 31 as well as 42 to 46 of the conductor frame 18, provided as the electrically conductive connection means 16, are completely enclosed by the casing 5. In a further version of this embodiment according to the invention the conductor segments 20 to 25 and 28 to 31 as well as 42 to 46 of said conductor frame 18 may also be completely enclosed by the casing 5, whereas the holding foil 17 which acts as the holding means 6 extends at least partly as far as the periphery of the casing 5, it nevertheless being ensured that the conductor segments 20 to 25 and 28 to 31 as well as 42 to 46 which are completely enclosed by the casing 5 are reliably protected against disturbing external effects.

What is claimed is:

1. A device (1) which is provided with a data carrier (4) which is arranged for contactless communication with a communication station, includes a casing (5) which consists of an electrically insulating material and is formed by injection molding, includes holding means (6) which are surrounded by the casing (5) and are arranged to hold a chip (7) and at least one passive component (8, 13; 44) which is suitable for contactless communication, and is also provided with electrically conductive connection means (16) which are surrounded by the casing (5), thus being fully enclosed by the casing (5), are connected to the holding means (6) and by means of which a respective chip terminal (9, 10) of the chip (7) is electrically conductively connected to a respective component terminal (11, 12, 14, 15) of the at least one component (8, 13; 44), characterized in that the holding means (6) include a holding foil (17) of an electrically non-conductive synthetic material, that the connection means (16) are realized while utilizing a conductor frame (18) consisting of metal, that the connection means (16) are formed by conductor segments (20, 21, 22, 23, 24, 25, 28, 29, 30, 31; 42, 43, 45, 46) of said conductor frame (18) which are completely enclosed by the casing (5), and that at least parts of the conductor segments (20, 21, 22, 23, 24, 25, 28, 29, 30, 31; 42, 43, 45, 46) of said conductor frame (18) are connected to the holding foil (17) in order to hold said conductor segments (20, 21, 22, 23, 24, 25, 28, 29, 30, 31; 42, 43, 45, 46).

2. A device (1) as claimed in claim 1, characterized in that in addition to the conductor segments (20, 21, 22, 23, 24, 25, 28, 29, 30, 31; 42, 43, 45, 46) in said conductor frame (18) which constitute the connection means (16) there are also provided holding segments (32, 33, 34, 35, 36) in said conductor frame 18 which are mechanically and electrically separated from the conductor segments (20, 21, 22, 23, 24, 25, 28, 29, 30, 31; 42, 43, 45, 46), that parts of the holding segments (32, 33, 34, 35, 36) of said conductor frame (18) are connected to the holding foil (17) in order to hold the holding segments (32, 33, 34, 35, 36), and that the holding segments (32, 33, 34, 35, 36) of said conductor frame terminate at the area of the periphery of the casing.

3. A device (1) as claimed in claim 1, characterized in that the holding foil (17) is formed by a foil of polyimide.

4. A device (1) as claimed in claim 3, characterized in that the holding foil (17) and the parts of the conductor segments (20, 21, 22, 23, 24, 25, 28, 29, 30, 31; 42, 43, 45, 46) of said conductor frame (18) are connected to one another by means of an adhesive layer (37) which is formed by a hot-melt adhesive.

5. A device (1) as claimed in claim 1, characterized in that the conductor segments (20, 21, 22, 23, 24, 25, 28, 29, 30, 31; 42, 43, 45, 46) are provided at least partly with a layer of silver on their peripheral surfaces which are remote from the holding foil (17).

6. A device (1) as claimed in claim 1, characterized in that the conductor segments (20, 29, 24 and 21, 30, 23, 31) are arranged to connect a respective one of two chip terminals (9, 10) of the chip (7) to a respective one of two coil terminals (11, 12) of a transmission coil (8) which is suitable for contactless communication.

7. A device (1) as claimed in claim 6, characterized in that the conductor segments (22, 29, 24 and 23, 31, 25) are additionally arranged to connected a respective one of the two chip terminals (9, 10) of the chip (7) to a respective one of two capacitor terminals (14, 15) of a capacitor (13).

8. A device (1) as claimed in claim 7, characterized in that the conductor segments (24, 29, 22, 45, 42 and 25, 31, 23, 46, 43) are additionally arranged to connect a respective one of the two chip terminals (9, 10) of the chip (7) to a respective one of two resistor terminals of a resistor (44).

9. A data carrier (4) which is arranged for contactless communication with a communication station, includes a casing (5) which consists of an electrically insulating material and is formed by injection molding, includes holding means (6) which are surrounded by the casing (5) and are arranged to hold a chip (7) and at least one passive component (8, 13; 44) which is suitable for contactless communication, and is also provided with electrically conductive connection means (16) which are surrounded by the casing (5), thus being fully enclosed by the casing (5), are connected to the holding means (6), and by means of which a respective chip terminal (9, 10) of the chip (7) is electrically conductively connected to a respective component terminal (11, 12, 14, 15) of the at least one component (8, 13; 44), characterized in that the holding means (6) include a holding foil (17) of an electrically non-conductive synthetic material, that the connection means (16) are realized while utilizing a conductor frame (18) consisting of metal, that the connection means (16) are formed by conductor segments (20, 21, 22, 23, 24, 25, 28, 29, 30, 31; 42, 43, 45, 46) of said conductor frame (18) which are completely enclosed by the casing (5), and that at least parts of the conductor segments (20, 21, 22, 23, 24, 25, 28, 29, 30, 31; 42, 43, 45, 46) of said conductor frame (18) are connected to the holding foil (17) in order to hold said conductor segments (20, 21, 22, 23, 24, 25, 28, 29, 30, 31; 42, 43, 45, 46).

10. A data carrier (4) as claimed in claim 9, characterized in that in addition to the conductor segments (20, 21, 22, 23, 24, 25, 28, 29, 30, 31; 42, 43, 45, 46) in said conductor frame (18) which constitute the connection means (16) there are also provided holding segments (32, 33, 34, 35, 36) in said conductor frame (18) which are mechanically and electrically separated from the conductor segments (20, 21, 22, 23, 24, 25, 28, 29, 30, 31; 42, 43, 45, 46), that parts of the holding segments (32, 33, 34, 35, 36) of said conductor frame (18) are connected to the holding foil (17) in order to hold the holding segments (32, 33, 34, 35, 36), and that the holding segments (32, 33, 34, 35, 36) of said conductor frame terminate at the area of the periphery of the casing.

11. A data carrier (4) as claimed in claim 9, characterized in that the holding foil (17) is formed by a foil of polyimide.

12. A data carrier (4) as claimed in claim 11, characterized in that the holding foil (17) and the parts of the conductor segments (20, 21, 22, 23, 24, 25, 28, 29, 30, 31; 42, 43, 45, 46) of said conductor frame (18) are connected to one another by means of an adhesive layer (37) which is formed by a hot-melt adhesive.

13. A data carrier (4) as claimed in claim 9, characterized in that the conductor segments (20, 21, 22, 23, 24, 25, 28, 29, 30, 31; 42, 43, 45, 46) are provided at least partly with a layer of silver on their peripheral surfaces which are remote from the holding foil (17).

14. A data carrier (4) as claimed in claim 9, characterized in that the conductor segments (20, 29, 24 and 21, 30, 23, 31) are arranged to connect a respective one of two chip terminals (9, 10) of the chip (7) to a respective one of two coil terminals (11, 12) of a transmission coil (8) which is suitable for contactless communication.

15. A data carrier (4) as claimed in claim 14, characterized in that the conductor segments (22, 29, 24 and 23, 31, 25) are additionally arranged to connect a respective one of the two chip terminals (9, 10) of the chip (7) to a respective one of two capacitor terminals (14, 15) of a capacitor (13).

16. A data carrier (4) as claimed in claim 15, characterized in that the conductor segments (24, 29, 22, 45, 42 and 25, 31, 23, 46, 43) are additionally arranged to connect a respective one of the two chip terminals (9, 10) of the chip (7) to a respective one of two resistor terminals of a resistor (44).

\* \* \* \* \*